(12) United States Patent
Hirai et al.

(10) Patent No.: US 7,399,560 B2
(45) Date of Patent: Jul. 15, 2008

(54) METHOD FOR MANUFACTURING MASK, METHOD FOR MANUFACTURING WIRING PATTERN, AND METHOD FOR MANUFACTURING PLASMA DISPLAY

(75) Inventors: Toshimitsu Hirai, Chino (JP); Hiroshi Kiguchi, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/749,365

(22) Filed: May 16, 2007

(65) Prior Publication Data

US 2008/0003509 A1    Jan. 3, 2008

(30) Foreign Application Priority Data

Jun. 30, 2006    (JP)    ............................. 2006-181369

(51) Int. Cl.
*G03F 1/00*    (2006.01)
*H05B 33/10*    (2006.01)

(52) U.S. Cl. ........................... 430/5; 430/311; 430/319; 430/321; 430/330; 427/164; 347/106; 347/107

(58) Field of Classification Search ....................... None
See application file for complete search history.

(56) References Cited

U.S. PATENT DOCUMENTS

| 5,637,426 | A * | 6/1997 | Uchikawa | ....................... 430/9 |
| 2003/0024103 | A1 * | 2/2003 | Kiguchi et al. | ................ 29/601 |
| 2004/0191641 | A1 * | 9/2004 | Ray et al. | ....................... 430/5 |
| 2004/0247797 | A1 * | 12/2004 | Hirai | ........................... 427/534 |

FOREIGN PATENT DOCUMENTS

| JP | 11-343442 | 12/1999 |
| JP | 2003-315813 | 11/2003 |
| JP | 2004-071473 | 3/2004 |

* cited by examiner

*Primary Examiner*—John A. McPherson
(74) *Attorney, Agent, or Firm*—Harness, Dickey & Pierce, P.L.C.

(57) ABSTRACT

A method for manufacturing a mask includes performing a lyophobic treatment on at least one surface of a translucent substrate; disposing a light-shielding material on the surface subjected to the lyophobic treatment of the translucent substrate in a desired shape by using a droplet discharge method; and firing the light-shielding material so as to form a light-shielding pattern on the translucent substrate.

5 Claims, 4 Drawing Sheets

METHOD FOR MANUFACTURING MASK, METHOD FOR MANUFACTURING WIRING PATTERN, AND METHOD FOR MANUFACTURING PLASMA DISPLAY

BACKGROUND

1. Technical Field

The present invention relates to a method for manufacturing a mask, a method for manufacturing a wiring pattern, and a method for manufacturing a plasma display.

2. Related Art

As methods for forming a pattern (wiring pattern) on a substrate, such methods as screen printing, sputtering, vapor deposition, and the like are commonly used. Each of such methods uses a mask for applying or depositing wiring forming materials in a desired shape so as to form a pattern.

Another example of the method using a mask, disclosed by JP-A-2004-71473 for example, is known. The method provides a wettability variable layer on a substrate and applies energy such as ultraviolet rays through a mask so as to form a region having high wettability and a region having low wettability. Then the method applies a coating liquid to the regions so as to form a pattern.

Here, the mask used in the above example is composed of a translucent mask substrate and a mask pattern. The mask pattern is formed by the above-mentioned method for forming a pattern, for example sputtering, on the mask substrate. However, the method for forming a pattern by sputtering requires a mask for an original plate when patterning. In general, the mask for an original plate is very expensive, so that the cost for manufacturing a mask could not have been sufficiently cut down.

SUMMARY

An advantage of the present invention is to provide a method for manufacturing a mask by which a mask can be obtained at low cost, a method for manufacturing a wiring pattern in which the manufacturing cost is cut down by using an inexpensive mask, and a method for manufacturing a plasma display in which the manufacturing cost is cut down by using an inexpensive mask.

A method for manufacturing a mask according to a first aspect of the invention includes: performing a lyophobic treatment on at least one surface of a translucent substrate; disposing a light-shielding material on the surface subjected to the lyophobic treatment of the translucent substrate in a desired shape by using a droplet discharge method; and firing the light-shielding material so as to form a light-shielding pattern on the translucent substrate.

According to the method of the aspect, since the method forms the light-shielding pattern on a desired position by droplet discharge, the method needs no mask for an original plate which corresponds to the pattern shape, for example, when patterning light-shielding material. Thus the method can cut the manufacturing cost of the mask. If the method is applied especially when manufacturing masks, such as a mask for forming a wiring pattern, in many kinds and small quantities, the wiring pattern and the like which are formed by using the mask can be formed at low cost.

A method for manufacturing a wiring pattern according to a second aspect of the invention includes: (a) forming a mask by performing a lyophobic treatment on at least one surface of a translucent substrate, disposing a light-shielding material on the surface subjected to the lyophobic treatment of the translucent substrate by using a droplet discharge method, and firing the light-shielding material to form a light-shielding pattern on the translucent substrate; (b) performing a lyophobic treatment on one surface of a base member; (c) giving a lyophilic property to a part of the surface subjected to the lyophobic treatment of the base member by irradiating the surface subjected to the lyophobic treatment with light through the mask, so as to form a lyophilic region; (d) disposing a conductive functional liquid on the lyohilic region by using the droplet discharge method; and (e) firing the conductive functional liquid so as to form a wiring pattern.

According to the method of the aspect, since the method forms the light-shielding pattern on a desired position by droplet discharge, the method needs no mask corresponding to the pattern shape and conventionally required when patterning light-shielding material. Thus the method can cut the manufacturing cost of the mask. Using the inexpensive mask can manufacture the wiring pattern at low cost. If the method is applied especially when manufacturing a wiring pattern by using a mask produced in many kinds and small quantities, the wiring pattern can be formed at low cost.

Here, though the width of light-shielding pattern can not be made smaller than the discharge diameter of a droplet discharged by droplet discharge, the light-shielding pattern can be disposed by a smaller interval than the discharge diameter. Light transmits between the light-shielding patterns disposed by such smaller interval than the droplet diameter, being able to form the lyophilic region having a smaller width than the droplet diameter on the surface subjected to the lyophobic treatment.

Thus the periphery of the lyophilic region is lyophobic. Therefore, even when the droplet discharge diameter is larger than the width of the lyophilic region, the conductive functional liquid disposed on the lyophilic region wets and spreads preferably in the lyophilic region. Accordingly, the wiring pattern having a smaller width than the droplet diameter can be formed.

In the method of the aspect, a layered structure may be formed by repeating following processes: covering the wiring pattern with an insulating film; performing the lyophobic treatment on the insulating film; forming the lyophilic region on the surface subjected to the lyophobic treatment of the insulating film by using the mask formed by step (a); and forming another wiring pattern on the lyophilic region.

Thus the fine wiring patterns are layered to provide the structure which can be highly integrated at low cost.

In the method of the aspect, it is preferable that the step (a) include disposing a photocatalyst promoting lyophilicity by being irradiated with light between the light-shielding pattern such that the photocatalyst is equal or higher than the light-shielding pattern; the mask be disposed so as to bring the photocatalyst thereon into contact with the surface subjected to the lyophobic treatment of the base member; and then the lyopilic region be formed by irradiating with light.

Thus the lyophilic treatment is promoted by the photocatalyst effect of the photocatalyst contacting the surface subjected to the lyophobic treatment when irradiating with light, being able to form the lyophilic pattern in a short time.

A method for manufacturing a plasma display of a third aspect includes: forming a mask by performing a lyophobic treatment on at least one surface of a translucent substrate, disposing a light-shielding material on the surface subjected to the lyophobic treatment of the translucent substrate by using a droplet discharge method, and firing the light-shielding material so as to form a light-shielding pattern on the translucent substrate; performing the lyophobic treatment on one surface of at least one of a pair of substrates which are disposed to oppose each other; giving a lyophilic property to a part of the surface subjected to the lyophobic treatment of the substrate by irradiating the surface subjected to the lyophobic treatment through the mask so as to form a lyophilic region; disposing a conductive functional liquid on the lyophilic region by using a droplet discharge method; and firing the conductive functional liquid so as to form at least one of an address electrode that is formed on one substrate of the pair of substrates and a bus electrode that is formed on the other substrate.

According to the method of the aspect, at least one of the address electrode and the bus electrode may be manufactured with the mask which is provided at low cost by disposing to form the light-shielding pattern on a desired position by droplet discharge. Accordingly the plasma display equipped with the address electrode and the bus electrode can be provided at low cost.

BRIEF DESCRIPTION OF THE DRAWINGS

The invention will be described with reference to the accompanying drawings, wherein like numbers reference like elements.

DESCRIPTION OF THE EXEMPLARY EMBODIMENT

Embodiments of the present invention will be described below.

First Embodiment

A method for manufacturing a mask according to a first embodiment of the invention will be first described. Note that a mask provided in this embodiment will be used in a method for manufacturing a wiring pattern and a method for manufacturing a plasma display mentioned later.

Figure 1:
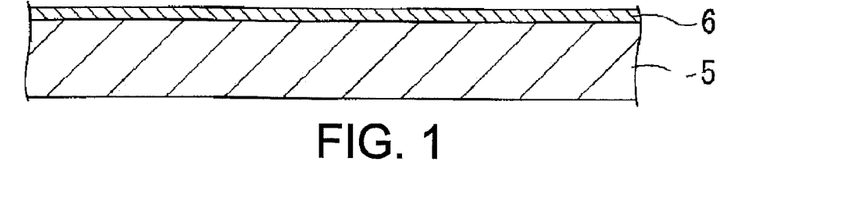
FIG. 1 is a schematic view illustrating a process of a method for manufacturing a mask according to an embodiment.
Figure 2:
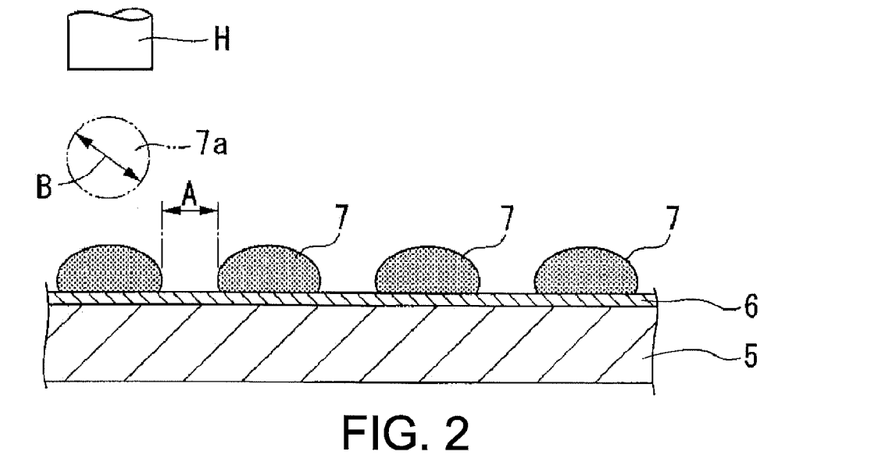
FIG. 2 is a schematic view illustrating a process of a method for manufacturing a mask following to the process of FIG. 1.
Figure 3:
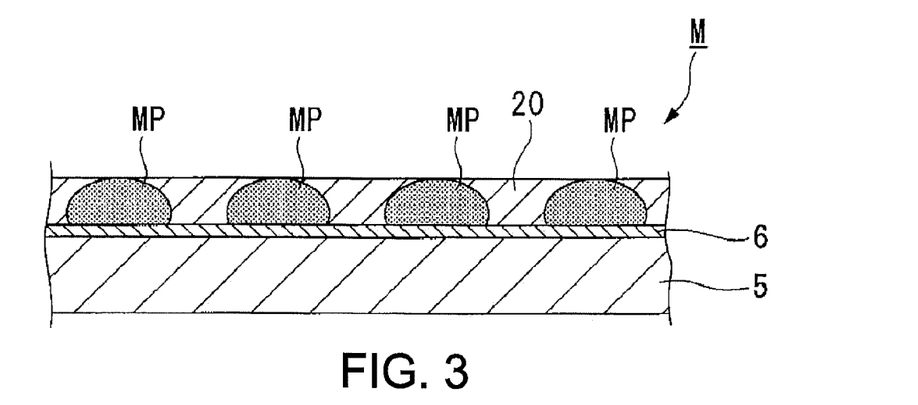
FIG. 3 is a schematic view illustrating a process of a method for manufacturing a mask following to the process of FIG. 2.

FIGS. 1 through 3 are schematic views illustrating processes of manufacturing a mask of the embodiment. This method for manufacturing a mask of the embodiment is effective especially to manufacturing a wide variety of products in small quantities.

A glass substrate (translucent substrate) 5 is first prepared as a base material of a mask and, as shown in FIG. 1, one surface of the glass substrate 5 is subjected to lyophobic treatment. As shown in FIG. 1, as a method for giving a lyophobic property to the glass substrate 5, the embodiment disposes a self assembled film (a self assembled monolayer: SAM) 6 made of organic molecules or the like. It is preferable to perform pretreatments such as irradiating the surface of the glass substrate 5 with ultraviolet rays or cleaning by a medium before forming the self assembled film 6.

Here, the self-assembled film 6 is composed of a bonding functional group that can react with atoms constituting the surface of the glass substrate 5, and straight chain molecules other than the bonding functional group. The self-assembled film 6 is formed by orientating a compound having an extremely high orientation due to the interaction of the straight chain molecules. Since the self-assembled film is provided by orienting monomolecules, the film is extremely thin and even at molecular level. In other words, since identical molecules are arranged over the film surface, the film surface can be provided with an even and excellent lyophobic property.

Examples of the compound preferably forming the self-assembled film 6 having high orientation include fluoroalkylsilane (hereafter, referred to as "FAS") such as heptadecafluoro-1,1,2,2-tetrahydrodecyl-triethoxysilane, heptadecafluoro-1,1,2,2-tetrahydrodecyl-trimethoxysilane, heptadecafluoro-1,1,2,2-tetrahydrodecyl-trichlorosilane, tridecafluoro-1,1,2,2-tetrahydrooctyl-triethoxysilane, tridecafluoro-1,1,2,2-tetrahydrooctyl-trimethoxysilane, tridecafluoro-1,1,2,2-tetrahydrooctyl-trichlorosilane, trifluoropropyl trimethoxysilane, and the like. One of these compounds may be used alone, or alternatively two or more of them may be used in combination.

FAS is generally represented by a structural formula: $R_n$—Si—$X_{(4-n)}$. In the formula, n indicates an integer number from 1 to 3 inclusive, and X indicates hydrolytic groups such as a methoxy group, an ethoxy group, a halogen atom, and the like. Further, R indicates a fluoroalkyl group having the following structure: $(CF_3)(CF_2)x(CH_2)y$ where x indicates an integer number from 0 to 10 inclusive, and y indicates an integer number from 0 to 4 inclusive. If a plurality of Rs or Xs are bonded with Si, the Rs or the Xs can be same or different from each other. The hydrolytic group indicated by X hydrolyzes to form silanol and reacts with a hydroxyl group of the glass substrate 5 which is the fundamental layer of FAS, thereby bonding with the glass substrate 5 by siloxane bond. On the other hand, since the R includes the fluoro group such as $(CF_3)$ on its surface, the R modifies the surface of the glass substrate 5 which is the fundamental layer into an unwettable surface (having low surface energy and high lyophobic property).

The method for forming the self assembled film 6 mentioned above may use a vapor phase or liquid phase compound which is the material of the self assembled film 6. When the compound is vapor phase, the compound and the glass substrate 5 are contained together in a closed container and, in case at room temperature, left for a couple of days so as to form the self assembled film 6 on the glass substrate 5. Keeping the whole closed container at 100 degrees Celsius can shorten the time for forming the self assembled film 6 on the glass substrate 5 to about three hours. On the other hand, when the compound is liquid phase, the glass substrate 5 is dipped in a solution including the compound, washed, and dried so as to obtain the self assembled film 6 on the glass substrate 5.

Alternative way giving lyophobic property to the glass substrate 5 other than forming a self assembled film is a method using plasma irradiation under normal or vacuumed pressure. The gas used for this plasma irradiation can be selected variously, depending on the surface material of the glass substrate 5. For example, fluorocarbon gases such as tetrafluoromethane, perfluorohexane, and perfluorodecane can be used as a treatment gas. In this case, a fluoride polymerized film which is lyophobic can be provided on the surface of the glass substrate 5. The plasma treatment is carried out under the following condition: for example, plasma power from 50 to 1000 W, a volume of tetrafluoromethane gas flow from 50 to 100 mL/min, a velocity of base member transportation with respect to a plasma discharge electrode from 0.5 to 1020.0 mm/sec, and a base member temperature from 70 to 90 degrees Celsius.

Subsequently, on the self assembled film 6 provided on the glass substrate 5 and subjected to lyophobic treatment, a functional ink (light-shielding material) 7 is deposited by droplet discharge (ink-jetting). The functional ink 7 has light shielding property for forming a mask pattern. The functional ink 7 is composed of a dispersion liquid obtained by dispersing the conductive particulates in the disperse medium. The embodiment uses metal particulates including, for example, silver, copper, chromium, nickel and the like as the conductive particulates. The conductive particulates may be used with their surfaces coated with an organic matter, for example, in order to improve their dispersibility.

Any dispersion medium that is capable of dispersing the above-described conductive particulates and does not cause an aggregation can be used. Waters, alcohols, hydrocarbon compounds, ether compounds are preferably used in terms of particulates dispersibility, dispersion liquid stability, and applicability to the droplets discharge method.

Here, examples of droplet discharge techniques may include charge control, pressurized vibration, electromechanical conversion, electrothermal conversion, and electrostatic attraction. The charge control is a method to apply electric charges to a material with a charged electrode so as to discharge the material from a discharge nozzle while controlling its flying direction with a deflection electrode. The pressurized vibration is a method that ultra-high pressure of approximately 30 kg/cm$^2$ is applied to a material so as to discharge the material at a discharge nozzle tip. If no control voltage is applied, the material goes straight ahead so as to be discharged from the discharge nozzle. If the control voltage is applied, electrostatic repulsion occurs within the material so as to disperse the material, thereby discharging no material from the discharge nozzle. The electromechanical conversion is a method that uses the deformation characteristic of piezoelectric elements in response to a pulsed electric signal. The method applies pressure to a space storing a material with an elastic material therebetween by deforming a piezoelectric element and pushes the material out of the space to discharge it from a discharge nozzle.

The electrothermal conversion is a method that evaporates a material rapidly with a heater provided in a space storing the material so as to produce bubbles, and discharges the material out of the space by using pressure of the bubbles. The electrostatic attraction is a method that applies micro pressure to a space storing a material so as to form a meniscus of the material at a discharge nozzle, and applies electrostatic attraction so as to pull out the material. Other than these methods, a method that uses a fluid viscosity change caused by an electric field, and a method that uses electric discharge sparks can also be employed. The droplet discharge has an advantage of adequately disposing a material in a desired amount to a desired position with little waste of the material.

The embodiment discharges the functional ink 7 to the glass substrate 5 from an inkjet head (droplet discharge head) H of the inkjet device (droplet discharge device), as shown in FIG. 2. Such inkjet device can dispose the functional ink 7 on a desired position so as to form a desired pattern on the glass substrate 5 without a photolithography process using a mask.

As shown in FIG. 2, a pattern drawn by the functional ink 7 which is discharged on the glass substrate 5 has an equal or larger width than a discharge diameter B (50 μm, for example) of a droplet 7a discharged from the inkjet head H, and thus the width of the pattern can not be made substantially smaller than the discharge diameter B. However, controlling a position of the inkjet head H can discharge the functional ink 7 to draw a pattern by a smaller interval A (40 μm, for example) than the discharge diameter B.

Firing Process

Subsequently, after being deposited on the glass substrate 5, the functional ink 7 is fired by performing heat treatment, for example, to the glass substrate 5.

The heat treatment is carried out in the normal atmosphere, but it can be carried out in the inert gas atmosphere such as nitrogen, argon or helium, as necessary. The treatment temperature for heat treatment is adequately determined in the light of the boiling point (vapor pressure) of the disperse medium; the type and pressure of the atmospheric gas; thermal behaviors such as dispersibility, oxidizability, and the like of the particulates; the presence and volume of the coating material; and the heat resistance temperature of the base material, and the like. The firing treatment is performed in the atmosphere at 150 to 200 degrees Celsius for 10 to 20 minutes with a clean oven. For example, eliminating organic matters in the organic silver compound requires firing at about 200 degrees Celsius. The above process converts the functional ink 7 after discharging process to a mask pattern (light-shielding pattern) MP shown in FIG. 3.

The mask pattern MP formed as above is disposed by a smaller interval A than the discharge diameter B.

Next, between the mask patterns MP provided on the glass substrate 5, a photocatalyst 20 is disposed to have a higher, more preferably equal height to the height of the mask pattern MP. The photocatalyst 20 is made of material promoting lyophilic treatment when irradiated with light mentioned later. Examples of the material may include titanium oxide, zinc oxide, tin oxide, and the like. One of these may be used alone, or alternatively two or more of them may be used in combination.

The embodiment uses titanium oxide among these materials of the photocatalyst 20, due to its high band gap energy, chemical stability, no toxicity, and easy procurement. The photocatalyst 20 can be formed by hydrolyzing, dehydrate-condensing, and then firing titanium inorganic salt such as titanium tetrachloride and the like, or organic titanium compounds such as tetraethoxytitanium and the like, on the glass substrate 5. The above processes manufacture the mask M.

Since the mask pattern MP can be formed on the desired position by ink-jetting, the embodiment does not need a mask corresponding to a pattern shape when patterning light-shielding material, being able to cut the manufacturing cost of a mask. Application of the invention, especially for manufacturing a wide variety of products in small quantities, cuts the cost of the mask M, so that a low-cost wiring pattern can be manufactured by using the mask M as mentioned later.

Second Embodiment

Next, a method for manufacturing a wiring pattern according to a second embodiment of the invention will be described. The embodiment describes a method for manufacturing a wiring pattern having a narrower width than a diameter of a droplet discharged from an inkjet head H as mentioned later. The method of the embodiment is applicable when forming a wiring pattern having a desired width.

The embodiment irradiates a base member subjected to lyphobic treatment thereon with light through the mask M obtained by the method for manufacturing a mask in the first embodiment so as to form a lyophilic pattern on the lyophobic region. Then a wiring pattern is formed on the base member by ink-jetting (droplet discharge). Therefore, a description on a process of forming the mask M is omitted. In the embodiment, the base member includes not only a substrate but also an insulating layer provided on the substrate.

A wiring forming substrate (included in a base member) 100 for forming a wiring pattern is prepared. The embodiment uses a glass substrate as the wiring forming substrate 100.

Figure 4:
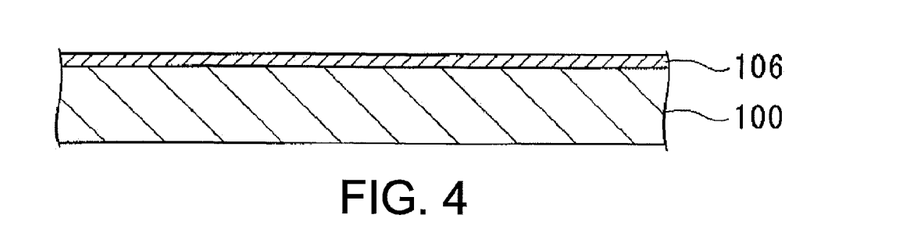
FIG. 4 is a schematic view illustrating a process of performing lyophobic treatment on a wiring forming substrate.

As shown in FIG. 4, lyophobic treatment by FAS is performed on one surface of the wiring forming substrate 100 as with the process of manufacturing a mask in the first embodiment. Thus, the wiring forming substrate 100 is provided with a self assembled film (lyophobic processed surface) 106. As an alternative example of lyophobic treatment, the wiring forming substrate 100 may be provided with fluorine functional group introduce silicon, fluorine resin, fluorine silane coupling agent or the like.

After provided as above, the self assembled film 106 is irradiated with light (ultraviolet rays) so as to form a lyophilic region.

Figure 5:
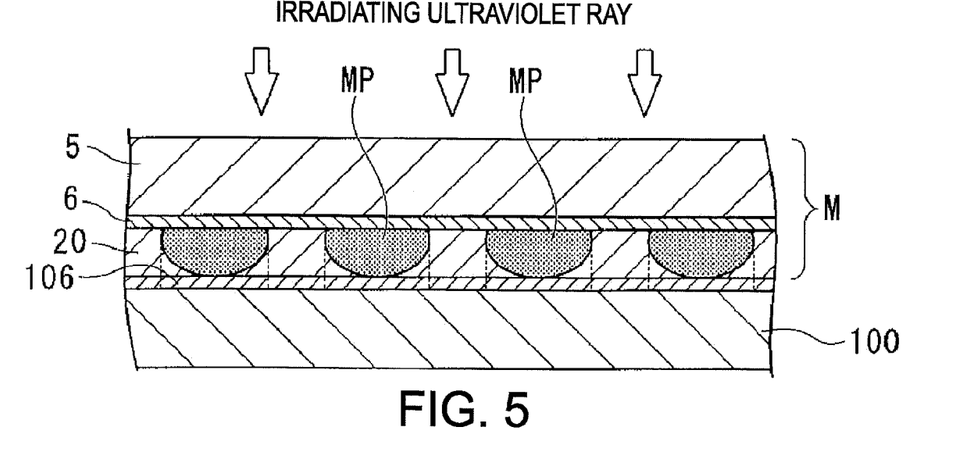
FIG. 5 is a schematic view illustrating a process of forming a lyophilic pattern on the wiring forming substrate.

In particular, as shown in FIG. 5, the mask M is disposed in a manner opposing its surface provided with the mask pattern MP and the photocatalyst 20 to the wiring forming substrate 100. In this case, since the photocatalyst 20 is disposed equal or higher than the mask pattern MP, the photocatalyst 20 contacts the surface of the wiring forming substrate 100. The wiring forming substrate 100 in such state is irradiated with ultraviolet rays (UV) through the mask M.

Figure 6:
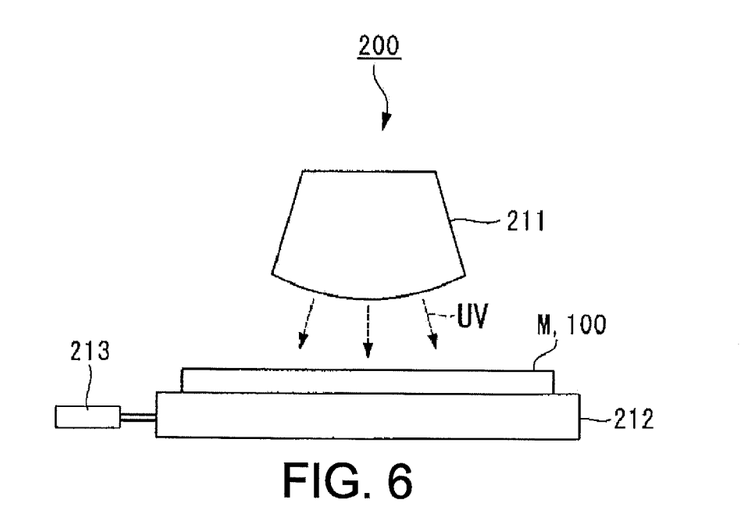
FIG. 6 is a schematic view showing a rough structure of an ultraviolet ray irradiating device.

FIG. 6 is a schematic view showing an ultraviolet ray irradiating device 200 which irradiates the wiring forming substrate 100 provided with the self assembled film 106 with ultraviolet rays.

As shown in FIG. 6, the ultraviolet ray irradiating device 200 includes an ultraviolet ray emitting part 211 which can emit ultraviolet rays having a predetermined wavelength, and a stage 212 which supports the glass substrate 5. The wiring forming substrate 100 supported on the stage 212 are irradiated through the mask M with ultraviolet rays emitted from the ultraviolet ray emitting part 211.

To the stage 212, a stage driving part 213 is provided, and it is capable of allowing the stage 212 supporting the wiring forming substrate 100 to scan in the predetermined direction. The ultraviolet ray irradiating device 200 emits ultraviolet rays from the ultraviolet ray emitting part 211 while scanning the wiring forming substrate 100 in the predetermined direction so as to irradiate the wiring forming substrate 100 with ultraviolet rays. When the wiring forming substrate 100 is small, the wiring forming substrate 100 may be irradiated with ultraviolet rays without being scanned. It is obvious that the wiring forming substrate 100 may be irradiated with ultraviolet rays while moving the ultraviolet ray emitting part 211.

For example, when using a lump of 254 nm wavelength and 15 mW/cm$^2$ lump intensity, conditions for irradiating ultraviolet rays are the following: the glass substrate 5 is kept away from the lump about 17 mm, and reciprocated three times under the lump at 4 mm/sec so as to irradiate the whole surface with ultraviolet rays evenly.

Here, the ultraviolet ray irradiating device 200 irradiates the surface of the wiring forming substrate 100 through the mask M with ultraviolet rays as shown in FIG. 5. Some emitted ultraviolet rays are blocked by the mask pattern MP having a light-shielding property. Other rays transmit through the photocatalyst 20 provided between the mask patterns MP, so that the self assembled film 106 is irradiated with ultraviolet rays. When rays transmit through the mask M, the side faces of the mask pattern MP work in a self-aligning manner. In the region where rays transmit, since the photocatalyst 20 contacts the self assembled film 106 provided on the wiring forming substrate 100, lyophilic treatment is promoted at the contact faces by the photocatalyst effect. The photocatalyst effect promotes lyophilic treatment, even when the photocatalyst 20 is not brought into contact to the self assembled film 106.

Figure 7:
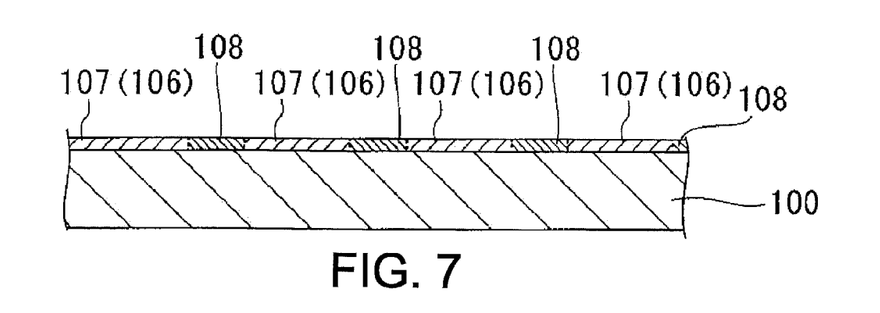
FIG. 7 is a schematic view showing a lyophilic pattern formed on the wiring forming substrate.

As shown in FIG. 7, the region irradiated with ultraviolet rays on the self assembled film 106 weakens lyophobic property thereof to be a lyophilic pattern (lyophilic region) 108. On the other hand, the region irradiated with no ultraviolet rays on the self assembled film 106 maintains lyohobic property thereof to be a lyophobic pattern 107. Thus, the wiring forming substrate 100 is provided with the lyophilic pattern 108 and the lyophobic pattern 107.

The lyophilic pattern 108 corresponds to the region irradiated with ultraviolet rays which transmit between the mask patterns MP. Therefore, the width of the lyophilic pattern 108 is same as the interval between the adjacent mask patterns MP. Thus, since the mask patterns MP are disposed by the interval A which is smaller than the diameter of a droplet discharged from the inkjet head H as shown in FIG. 2, the width of the lyophilic pattern 108, i.e. the interval A of FIG. 2 is smaller than the diameter of a droplet discharged from the inkjet head H.

Figure 8:
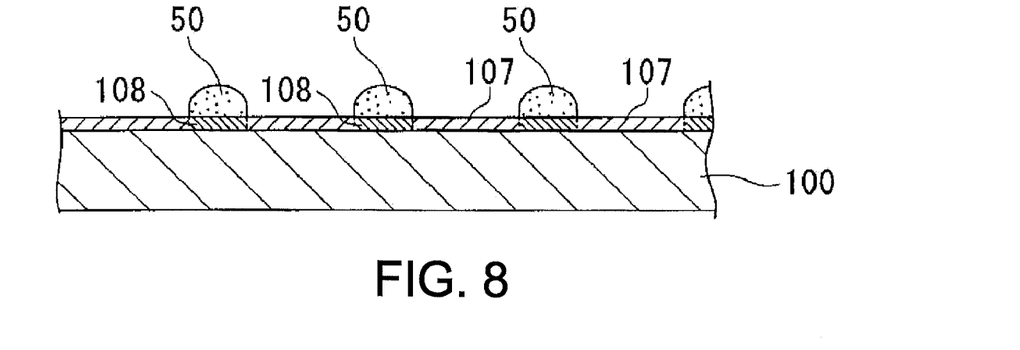
FIG. 8 is a schematic view showing the lyophilic pattern on which a conductive ink is disposed.

Subsequently, as shown in FIG. 8, to the lyophilic pattern 108 of the wiring forming substrate 100, conductive ink (conductive functional liquid) 50 is discharged from an inkjet head which is not shown. Here, before starting ink disposing, the mask M is removed from the wiring forming substrate 100.

As such conductive ink 50, an organic silver compound is used, and as the medium (dispersion medium), diethylene glycol diethyl ether is used for example. The lyophilic pattern 108 as a region where droplets are discharged to form a wiring pattern is surrounded by the lyophobic patterns 107 having lyophobic property. Therefore, even if the diameter of a discharged droplet is larger than the width of the lyophilic pattern 108, the ink wets and spreads preferably in the longitudinal direction of the lyohpilic pattern 108 to be deposited within the lyophilic pattern 108 favorably.

Figure 9:
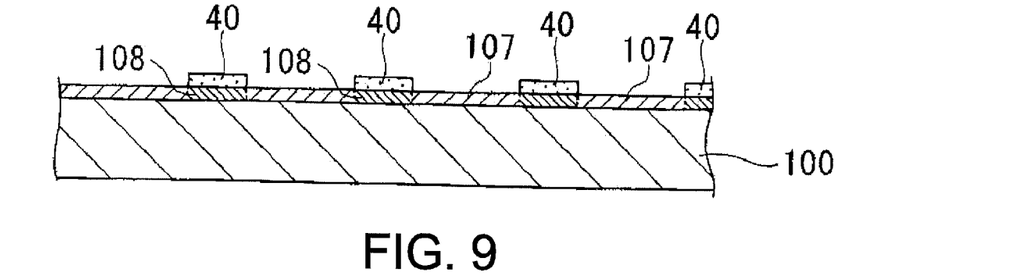
FIG. 9 is a schematic view showing a wiring pattern formed on the wiring forming substrate.

Then the conductive ink 50 is fired by heat treatment, accordingly being able to form a wiring pattern 40 as shown in FIG. 9. Since the firing process is same as the one in the manufacturing process of the mask M in the first embodiment, the description is omitted.

Since the method for manufacturing the wiring pattern 40 according to the embodiment forms the mask pattern MP on the desired position by ink-jetting, the method needs no mask for an original plate corresponding to a pattern shape and conventionally required when patterning light-shielding material. The mask for an original plate is substantially expensive in general. Thus, the method cuts the manufacturing cost of the mask M. Using such inexpensive mask M can manufacture the wiring pattern 40 at low cost.

The mask for an original plate which affects the manufacturing cost of the mask is rendered unnecessary, so that the manufacturing cost can be cut especially when the mask M is manufactured in many kinds and small quantities. Thus, using such mask M can manufacture the wiring pattern 40 at low cost.

In addition, the mask pattern MP is disposed by the interval smaller than the diameter of the discharged droplet 7a, so that the lyophilic pattern 108 having a smaller width than the diameter of the droplet 7a can be formed by ultraviolet rays which transmits between the mask patterns MP. Therefore, using the mask M provided with such mask patterns MP can manufacture the wiring pattern 40 having a smaller width than the droplet diameter of the conductive ink 50 at low cost.

Figure 10:
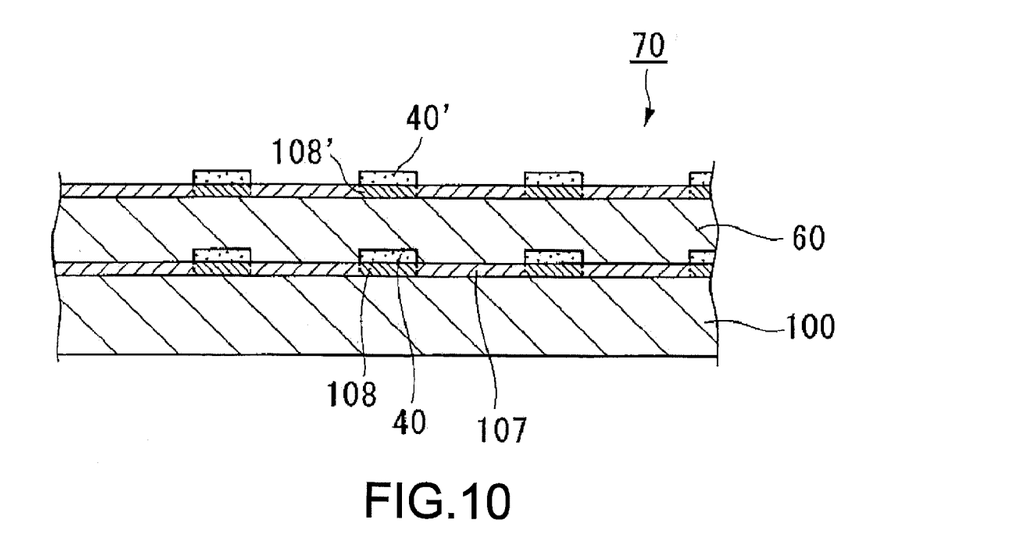
FIG. 10 is a schematic view showing a layered structure of wiring patterns.

Further, with the method for manufacturing a wiring pattern according to the embodiment of the invention, a layered structure 70 of wiring patterns may be formed as shown in FIG. 10.

In this case, after the wiring pattern 40 is provided on the wiring forming substrate 100, the layered structure 70 of wiring patterns can be formed by repeating the following processes: covering the wiring pattern 40 by an insulating film 60, performing lyophobic treatment on the insulating film 60, forming a lyophilic pattern (lyophilic region) 108' on the lyophobic processed surface of the insulating film 60 by using the mask M, and forming another wiring pattern 40' on the lyophilic pattern 108'. FIG. 10 shows a double layered structure in which the wiring patterns 40 and 40' are layered, but the method for manufacturing a wiring pattern according to the embodiment of the invention is applicable to a triple or more layered structure as well.

Third Embodiment

Next, a plasma display obtained by a method for manufacturing a plasma display according to a third embodiment of the invention will be described with reference to accompanying drawings.

Figure 11:
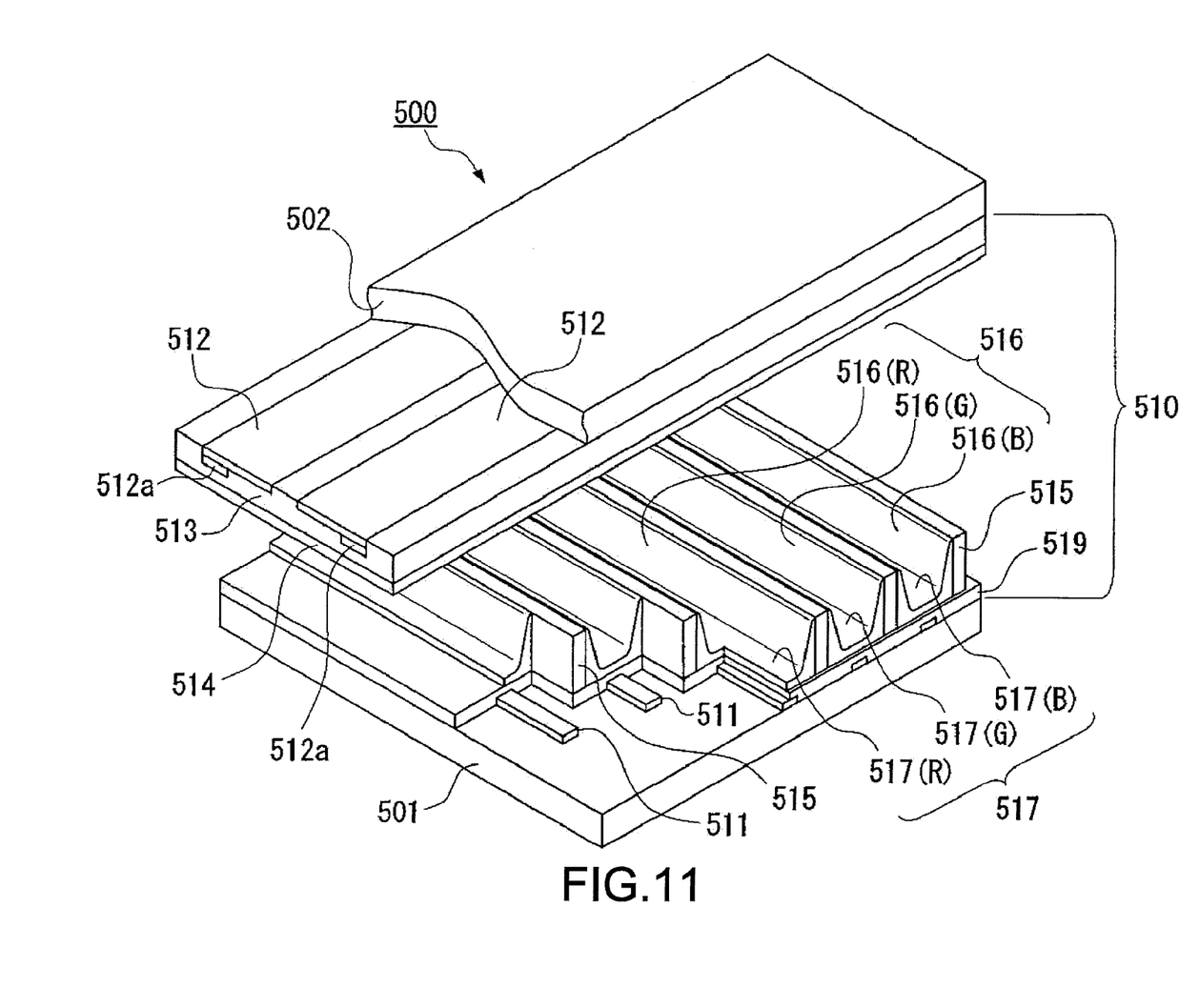
FIG. 11 is a perspective view showing a plasma display obtained by a manufacturing method of the embodiment.

FIG. 11 is an exploded perspective view of a plasma display 500. This plasma display 500 mainly includes a glass substrate (one substrate) 501 and a glass substrate (the other substrate) 502 which are disposed so as to oppose to each other, and a discharge display part 510 provided between these substrates.

The discharge display part 510 is composed of a plurality of discharge cells 516 integrated with each other, and the discharge cells 516 are arranged such that three discharge cells which are a red discharge cell 516 (R), a green discharge cell 516 (G), and a blue discharge cell 516 (B) form one pixel. On the upper surface of the (glass) substrate 501, an address electrode 511 is provided in a stripe shape having a predetermined interval. Covering the address electrode 511 and the upper surface of the substrate 501, a dielectric layer 519 is provided. Further, on the dielectric layer 519, a partition 515 is provided to locate between the address electrodes 511 and 511 in a manner going along each address electrode 511. There also is a partition (not shown) extending in a direction perpendicular to the address electrode 511 as well. The partition sections the partition 515 by a predetermined interval in the longitudinal direction of the partition 515. Adjacent partitions locating right and left sides of the address electrode 511 in the width direction, and partitions extending in the direction perpendicular to the address electrode 511 define to form a rectangular region. Corresponding to the rectangular region, the discharge cell 516 is formed, and three of these rectangular regions form one pixel. Further, inside the rectangular region defined by the partitions 515, a phosphor 517 is disposed. The phosphor 517 emits fluorescence of one of red, green, and blue. A red phosphor 517 (R) is disposed on the bottom of the red discharge cell 516 (R), a green phosphor 517 (G) on the bottom of the green discharge cell 516 (G), and a blue phosphor 517 (B) on the bottom of the blue discharge cell 516 (B).

On the glass substrate 502, a plurality of transparent display electrode 512 made of ITO are provided in a stripe shape having a predetermined interval in a direction perpendicular to the address electrode 511. In order to complement ITO having substantial resistance, a bus electrode 512a made of metal is also provided. Covering these electrodes, a dielectric layer 513 is provided, and a protective layer 514 made of MgO or the like is formed thereon. Then, two substrates of the glass substrate 501 and the glass substrate 502 are bonded to each other such that the address electrodes 511 and the display electrodes 512 face perpendicular to each other, and a space enclosed by the glass substrate 501, the partition 515, and the protection layer 514 provided on the glass substrate 502 is exhausted and filled with rare gas to form the discharge cell 516. Each two display electrodes 512 formed on the substrate 502 is disposed in corresponding to each discharge cell 516. The address electrode 511 and the display electrode 512 are connected to an alternate current power source which is not shown. Applying electricity to the respective electrodes excites the phosphor 517 to emit light in a desired position of the discharge display part 510, thus being able to realize a color display.

In the method for manufacturing a plasma display according to the embodiment, especially the address electrode 511 provided on the glass substrate 501 and the bus electrode 512a provided on the glass substrate 502 are formed by the method for manufacturing a wiring pattern of the second embodiment.

Namely, these address electrode 511 and bus electrode 512 are formed by discharging conductive ink on lyophilic patterns formed on the glass substrates 501 and 502 with the above-mentioned mask M and firing it. Therefore, the address electrode 511 and the bus electrode 512a which have a smaller width than the droplet diameter of the conductive ink are able to be manufactured at low cost, accordingly being able to provide the plasma display 500 including these address electrode 511 and bus electrode 512a at low cost.

What is claimed is:

1. A method for manufacturing a mask, comprising:
    performing a lyophobic treatment on at least one surface of a translucent substrate;
    disposing a light-shielding material on the surface subjected to the lyophobic treatment of the translucent substrate in a desired shape by using a droplet discharge method; and
    firing the light-shielding material so as to form a light-shielding pattern on the translucent substrate.

2. A method for manufacturing a wiring pattern, comprising:
    (a) forming a mask by performing a lyophobic treatment on at least one surface of a translucent substrate, disposing a light-shielding material on the surface subjected to the lyophobic treatment of the translucent substrate by using a droplet discharge method, and firing the light-shielding material to form a light-shielding pattern on the translucent substrate;
    (b) performing a lyophobic treatment on one surface of a base member;

(c) giving a lyophilic property to a part of the surface subjected to the lyophobic treatment of the base member by irradiating the surface subjected to the lyophobic treatment with light through the mask, so as to form a lyophilic region;

(d) disposing a conductive functional liquid on the lyohilic region by using the droplet discharge method; and (e) firing the conductive functional liquid so as to form a wiring pattern.

3. The method for manufacturing a wiring pattern according to claim 2, wherein a layered structure is formed by repeating following processes: covering the wiring pattern with an insulating film; performing the lyophobic treatment on the insulating film; forming the lyophilic region on the surface subjected to the lyophobic treatment of the insulating film by using the mask formed by step (a); and forming another wiring pattern on the lyophilic region.

4. The method for manufacturing a wiring pattern according to claim 2, wherein the step (a) includes disposing a photocatalyst, the photocatalyst promoting lyophilicity by being irradiated with light, between the light-shielding pattern such that the photocatalyst is equal or higher than the light-shielding pattern; the mask is disposed so as to bring the photocatalyst thereon into contact with the surface subjected to the lyophobic treatment of the base member; and then the lyophilic region is formed by irradiating with light.

5. A method for manufacturing a plasma display, comprising:

forming a mask by performing a lyophobic treatment on at least one surface of a translucent substrate, disposing a light-shielding material on the surface subjected to the lyophobic treatment of the translucent substrate by using a droplet discharge method, and firing the light-shielding material so as to form a light-shielding pattern on the translucent substrate;

performing the lyophobic treatment on one surface of at least one of a pair of substrates which are disposed to oppose each other;

giving a lyophilic property to a part of the surface subjected to the lyophobic treatment of the substrate by irradiating the surface subjected to the lyophobic treatment with light through the mask, so as to form a lyophilic region;

disposing a conductive functional liquid on the lyohilic region by using a droplet discharge method; and firing the conductive functional liquid so as to form at least one of an address electrode that is formed on one substrate of the pair of substrates and a bus electrode that is formed on the other substrate of the pair of substrates.

* * * * *